(12) United States Patent
Kitai et al.

(10) Patent No.: US 9,726,690 B2
(45) Date of Patent: *Aug. 8, 2017

(54) ANGULAR ACCELERATION SENSOR AND ACCELERATION SENSOR

(71) Applicant: Murata Manufacturing Co., Ltd., Nagaokakyo-shi, Kyoto-fu (JP)

(72) Inventors: Masahiro Kitai, Nagaokakyo (JP); Masayuki Ichimaru, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 145 days.

This patent is subject to a terminal disclaimer.

(21) Appl. No.: 14/736,547

(22) Filed: Jun. 11, 2015

(65) Prior Publication Data
US 2015/0276788 A1    Oct. 1, 2015

Related U.S. Application Data

(63) Continuation of application No. PCT/JP2013/082931, filed on Dec. 9, 2013.

(30) Foreign Application Priority Data

Dec. 13, 2012  (JP) .................................. 2012-271987

(51) Int. Cl.
| B81B 3/00 | (2006.01) |
| G01P 15/08 | (2006.01) |
| G01P 15/12 | (2006.01) |
| G01P 15/18 | (2013.01) |
| H01L 29/84 | (2006.01) |

(52) U.S. Cl.
CPC ........ *G01P 15/0888* (2013.01); *G01P 15/123* (2013.01); *G01P 15/18* (2013.01); *H01L 29/84* (2013.01)

(58) Field of Classification Search
CPC ......................... B81B 3/0051; G01P 15/0888
See application file for complete search history.

(56) References Cited

U.S. PATENT DOCUMENTS

| 2005/0217378 A1* | 10/2005 | Ishikawa ................. G01P 1/023 |
| | | 73/514.01 |
| 2014/0047919 A1* | 2/2014 | Ichimaru ................. G01C 19/56 |
| | | 73/504.12 |

FOREIGN PATENT DOCUMENTS

| JP | 2005-283402 A | 10/2005 |
| JP | 2007-309654 A | 11/2007 |

(Continued)

OTHER PUBLICATIONS

Official Communication issued in International Patent Application No. PCT/JP2013/082931, mailed on Feb. 25, 2014.

*Primary Examiner* — Clayton E Laballe
*Assistant Examiner* — Dennis Hancock
(74) *Attorney, Agent, or Firm* — Keating & Bennett, LLP

(57) ABSTRACT

An angular acceleration sensor includes a planar surface extending along an X-Y plane, a fixed portion, a weight, a beam, and piezoresistors. The weight is supported by the fixed portion. The beam extends along an Y-axis and is connected to the fixed portion and the weight. The beam includes through-holes extending therethrough in a Z-axis direction and protrusions protruding in an X-axis direction. The positions of the piezoresistors in the Y-axis direction overlap those of the through-holes and are displaced from those of the width-direction protrusions.

18 Claims, 8 Drawing Sheets

(56) References Cited

FOREIGN PATENT DOCUMENTS

| JP | 2007-322200 A | 12/2007 |
|----|---------------|---------|
| JP | 2010-256234 A | 11/2010 |
| WO | 2012/153439 A1 | 11/2012 |

\* cited by examiner

ANGULAR ACCELERATION SENSOR AND ACCELERATION SENSOR

BACKGROUND OF THE INVENTION

1. Field of the Invention

The present invention relates to an angular acceleration sensor that detects angular acceleration using deflection stress generated in a beam and an acceleration sensor that detects acceleration using deflection stress generated in a beam.

2. Description of the Related Art

Angular acceleration sensors and acceleration sensors include a fixed portion, a weight, a beam, and a detector. The weight is elastically supported on the fixed portion by the beam. The detector detects the angular acceleration or the acceleration of the weight using stress generated in the beam.

Some angular acceleration sensors and acceleration sensors have a beam in which a through-hole is formed in order to reduce the rigidity of the beam (see, for example, Japanese Unexamined Patent Application Publication No. 2007-322200).

FIG. 8 is a plan view of an angular acceleration sensor having an existing structure according to Japanese Unexamined Patent Application Publication No. 2007-322200.

An angular acceleration sensor 101 includes a fixed portion 102 having a frame shape; a weight 103 having a planar shape; a beam 104 that forms a cross shape with the weight 103 and that is connected to the fixed portion 102 at both ends of the beam 104; and detection electrodes 105A, 105B, 105C, and 105D that are disposed on both sides of end portions of the beam 104. The beam 104 has through-holes 106, which are formed in the beam 104 excluding a part of the beam 104 connected to the weight 103. The through-holes 106 extend over substantially the entire length of the beam 104 and pass through the center of the beam 104 in the width direction.

By forming the through-holes 106 in the beam 104, the rigidity of the beam 104 is reduced. Therefore, the deflection of the beam 104 per unit angular acceleration of the weight 103 is increased. As a result, sensitivity in detecting angular acceleration is increased, and the S/N ratio of a detection signal is increased.

When a through-hole is formed in a beam, the rigidity of the beam is reduced and thereby the resonant frequency is reduced. It is difficult for acceleration sensors or angular acceleration sensors to detect a signal in a frequency band that is higher than a resonant frequency. Therefore, if the resonant frequency is low, a wide detection band cannot be realized. In order to increase the resonant frequency, it is necessary to change the design of the sensor so as to increase the width of the beam or decrease the width of the through-hole. However, if the design is changed in such a way, the rigidity of the beam is increased and the deflection of the beam is reduced, and therefore the sensitivity of the sensor is reduced. Accordingly, to date, it has been difficult to achieve both a wide detection band and a high S/N ratio.

If a housing or the like that supports the fixed portion becomes deflected or the temperature of the housing or the like becomes uneven, the fixed portion may receive stress and the stress may be transmitted from the fixed portion to the beam. If this occurs, the stress may be detected by the detector, and the S/N ratio of a detection signal may be reduced. In a case where the width of the beam is increased in order to obtain a wide detection band, the stress that the fixed portion receives is easily transmitted to the beam, and therefore the S/N ratio for a detection signal tends to be reduced. Thus, also in this respect, it has been difficult to achieve both a wide detection band and a high S/N ratio.

SUMMARY OF THE INVENTION

Preferred embodiments of the present invention provide an angular acceleration sensor and an acceleration sensor that achieve both a wide detection band and a high S/N ratio.

Various preferred embodiments of the present invention relate to angular acceleration sensors and acceleration sensors including a planar surface, a fixed portion, a weight, a beam, and a detection element. The weight is displaceably supported by the fixed portion. The beam extends along the planar surface and is connected to the fixed portion and the weight. The detection element is disposed in the beam and detects stress due to deflection of the beam along the planar surface.

In the structure described above, the beam includes a width-direction protrusion protruding in a width direction, and a position of the detection element in an extension direction of the beam is displaced from that of the width-direction protrusion.

Alternatively, in the structure described above, the beam includes a through-hole extending therethrough in a thickness direction that is perpendicular to the planar surface, and a position of the detection element in the extension direction overlaps that of the through-hole.

In the structure described above, preferably, a dimension of the beam in a width direction, which is a direction parallel to the planar surface and perpendicular to an extension direction, is larger than a dimension, in the width direction, of a connection portion at which the beam is connected to the fixed portion.

In the structure described above, preferably, the beam includes a fixed-portion-side end portion, a weight-side end portion, and a planar portion; and the detection element is disposed in the planar portion. The fixed-portion-side end portion is connected to the fixed portion. The weight-side end portion is connected to the weight. The planar portion is disposed between and connected to the fixed-portion-side end portion and the weight-side end portion, and the planar portion has a dimension in a thickness direction that is smaller than a dimension in the thickness direction of each of the fixed-portion-side end portion and the weight-side end portion, the thickness direction being a direction perpendicular to the planar surface.

In the structure described above, preferably, a dimension of the planar portion in the width direction is larger than a dimension of the fixed-portion-side end portion in the width direction.

In the structure described above, preferably, the weight includes a recessed portion recessed in the width direction along the planar surface, the fixed portion includes a protruding portion protruding in the width direction along the planar surface and facing the recessed portion of the weight, and the beam is connected to the protruding portion and the recessed portion at positions near a center of mass of the weight.

According to a preferred embodiment of the present invention, the beam preferably includes the width-direction protrusion, and the position of the detection element in the extension direction of the beam is displaced from that of the width-direction protrusion. Hence, the stress generated in the beam due to the angular acceleration or the acceleration of the weight is efficiently concentrated on the detection element. Therefore, even if the width of the beam is increased to increase the resonant frequency, the stress in the beam is efficiently concentrated on the detection element and the sensitivity in detecting angular acceleration or acceleration is increased. Accordingly, both a wide detection band and a high S/N ratio are achieved.

According to a preferred embodiment of the present invention, the beam has a through-hole, and the position of the detection element in the extension direction of the beam overlaps that of the through-hole. Hence, the stress generated in the beam due to the angular acceleration or the acceleration of the weight is efficiently concentrated on the detection element. Therefore, even if the width of the beam is increased to increase the resonant frequency, sensitivity in detecting angular acceleration or acceleration is increased, and both a wide detection band and a high S/N ratio are achieved.

In the case where the width of the beam that supports the weight is larger than that of a connection portion at which the beam is connected to the fixed portion, unwanted stress that the fixed portion receives due to the deflection or uneven temperature distribution of the housing or the like is not easily transmitted to the beam. Therefore, even if the width of the beam is increased to increase the resonant frequency, unwanted stress that is transmitted from the fixed portion to the detection element is reduced to the minimum, and the precision in detecting angular acceleration or acceleration is increased. Accordingly, a higher S/N ratio is achieved.

In the case where the beam includes the planar portion and the detection element is disposed in the planar portion, unwanted stress that the detection element receives due to the deflection or uneven temperature distribution of a housing and the like is not easily transmitted to the detection element. Moreover, the stress generated in the beam due to the angular acceleration or the acceleration of the weight is efficiently concentrated on the detection element. Therefore, even if the width of the beam is increased to increase the resonant frequency, sensitivity and precision in detecting angular acceleration or acceleration are increased, and a higher S/N ratio is achieved.

In the case where the dimension of the planar portion in the width direction is larger than that of the fixed-portion-side end portion, unwanted stress that the detection element receives due to the deflection or uneven temperature distribution of a housing and the like is not easily transmitted to the detection element. Therefore, even if the width of the beam is increased to increase the resonant frequency, precision in detecting angular acceleration or acceleration is increased, and a higher S/N ratio is achieved.

In the case where the protruding portion of the fixed portion and the beam are disposed in the recessed portion of the weight, the beam is able to be disposed near the center of mass of the weight, and a rotational balance around the center of mass of the weight is maintained. Moreover, the beam is located only at the center of mass of the weight, and therefore stress is concentrated on the beam. Therefore, even if the width of the beam is increased to increase the resonant frequency, sensitivity and precision in detecting angular acceleration or acceleration is increased, and a higher S/N ratio are achieved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

In the following description, an orthogonal coordinate system having the following axes will be referred to: a Z-axis extending in a thickness direction perpendicular to a planar surface of an angular acceleration sensor or an acceleration sensor; a Y-axis extending in an extension direction in which a beam extends along the planar surface; and an X-axis extending in a width direction of the beam along the planar surface and perpendicular to the Z-axis and the Y-axis.

First Preferred Embodiment

Hereinafter, an angular acceleration sensor 10 according to a first preferred embodiment of the present invention will be described.

Figure 1A:
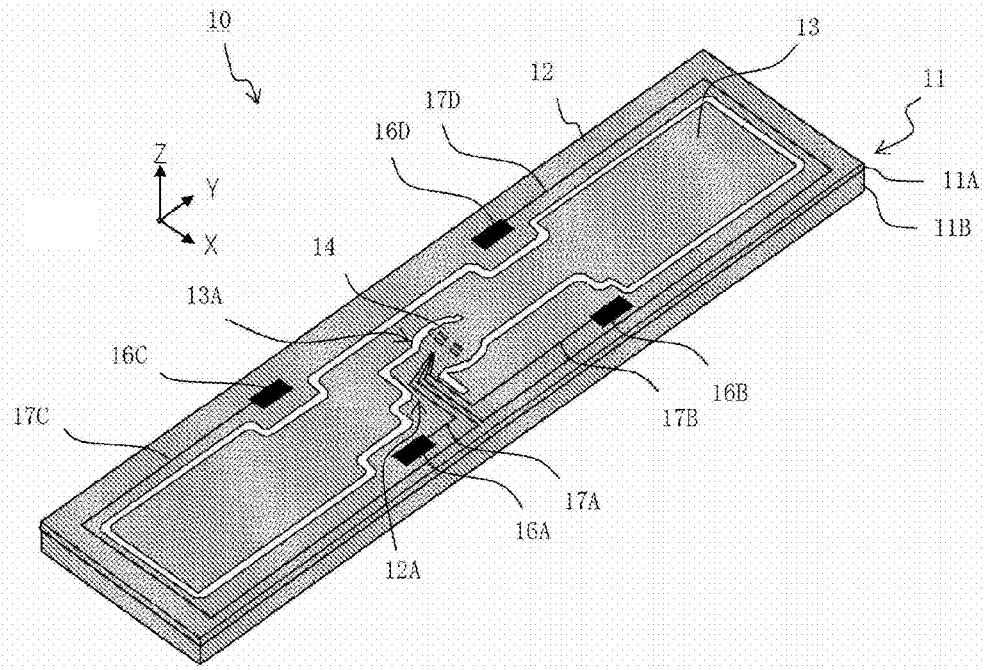
FIGS. 1A and 1B are perspective views of an angular acceleration sensor according to a first preferred embodiment of the present invention.

FIG. 1A is a perspective view of the angular acceleration sensor 10.

The angular acceleration sensor 10 includes a substrate 11; piezoresistors 15A, 15B, 15C, and 15D; terminal electrodes 16A, 16B, 16C, and 16D; and wiring lines 17A, 17B, 17C, and 17D. In FIG. 1, the piezoresistors 15A, 15B, 15C, and 15D are not illustrated.

The substrate 11 preferably has a rectangular or substantially rectangular planar shape having a longitudinal direction along the Y-axis, a transverse direction along the X-axis, and a thickness direction along the Z-axis. The substrate 11 has an opening that extends therethrough between two surfaces of the substrate 11 that face each other in the Z-axis direction. Due to the presence of the opening, the substrate 11 is divided into a fixed portion 12, a weight 13, and a beam 14.

The substrate 11 is made preferably by surface-processing an SOI (Silicon On Insulator) substrate. The substrate 11 includes an SOI layer 11A, which is located on the positive Z-axis side, and a base layer 11B, which is located on the negative Z-axis side. Technologies and devices for surface-processing an SOI substrate are well developed. Therefore, a plurality of rectangular or substantially rectangular plates can be manufactured efficiently with high precision. The SOI layer 11A is insulated from the base layer 11B by an insulating film. Each of the SOI layer 11A and the base layer 11B is made of a silicon-based material. The insulation film is made of an insulating material, such as silicon dioxide ($SiO_2$).

In the X-Y plane, the fixed portion 12 is disposed in an outer peripheral portion of the substrate 11 so as to have a frame shape that surrounds the weight 13 and the beam 14.

That is, the weight 13 and the beam 14 are disposed within an opening of the fixed portion 12. The fixed portion 12 is fixed to a housing or the like (not shown).

In the X-Y plane, the beam 14 has an extension direction along the Y-axis, a width direction along the X-axis, and a thickness direction along the Z-axis. A central portion of a side of the beam 14 facing in the positive X-axis direction and a central portion of a side of the beam 14 facing in the negative X-axis direction each protrude outward in the width direction. Thus, the beam 14 preferably has an elliptical or substantially elliptical shape. The shape of the beam 14 will be described below in detail. The beam 14 is connected to the fixed portion 12 at an end thereof in the negative Y-axis direction and is connected to the weight 13 at an end thereof in the positive Y-axis direction. The beam 14 is supported by the fixed portion 12 so as to not be in contact with the housing or the like (not shown).

In the X-Y plane, the weight 13 has a transverse direction along the X-axis and a longitudinal direction along the Y-axis. The weight 13 is supported by the fixed portion 12 via the beam 14 so as not to be in contact with the housing or the like (not shown) and so as to be displaceable in the X-Y plane.

To be specific, in the X-Y plane, a central portion of a side of the weight 13 facing in the positive X-axis direction is recessed in a plurality of steps (three steps) in the negative X-axis direction. The weight 13 includes a recessed portion 13A, which has a substantially rectangular or substantially rectangular shape, at the bottom of the recessed steps. In the X-Y plane, the fixed portion 12 protrudes in a plurality of steps (for example, three steps) in the negative X-axis direction so as to correspond to the three recessed steps of the side of the weight 13 facing in the positive X-axis direction. The fixed portion 12 includes a protruding portion 12A, which has a substantially rectangular or substantially rectangular shape, at the top of the protruding steps. The recessed portion 13A includes a wall facing in the negative Y-axis direction, a wall facing in the positive X-axis direction, and a wall facing in the positive Y-axis direction. The protruding portion 12A includes a wall facing in the positive Y-axis direction, a wall facing in the negative X-axis direction, and a wall facing in the negative Y-axis direction. The walls of the recessed portion 13A and the walls of the protruding portion 12A face each other with openings therebetween. The beam 14 extends in the positive Y-axis direction from the wall of the protruding portion 12A facing in the positive Y-axis direction and is connected to the wall of the recessed portion 13A facing in the negative Y-axis direction.

The beam 14 is able to be disposed at the center of mass of the weight 13 in the X-Y plane, because the weight 13 and the fixed portion 12 have the shapes described above. Therefore, when the weight 13 has angular acceleration around the Z-axis, the weight 13 maintains a rotational balance even though the weight 13 is supported by only one beam 14. Accordingly, all rotational inertial forces are concentrated on the beam 14 and the beam 14 becomes deflected by a large amount. Moreover, both end portions of the weight 13 in the Y-axis direction, which are located away from the beam 14, have large widths in the X-axis direction. Accordingly, the mass of the weight 13 is concentrated on both end portions of the weight 13 in the Y-axis direction. Therefore, the beam 14 has a large moment of inertia due to angular acceleration around the Z-axis. Thus, the beam 14 becomes easily deflected due to angular acceleration around the Z-axis, and the angular acceleration sensor 10 has high sensitivity in detecting angular acceleration.

The terminal electrodes 16A, 16B, 16C, and 16D are disposed on a surface of the fixed portion 12 facing in the positive Z-axis direction. The terminal electrode 16A and the terminal electrode 16B are arranged along a side of the fixed portion 12 facing in the positive X-axis direction. The terminal electrode 16C and the terminal electrode 16D are arranged along a side of the fixed portion 12 facing in the negative X-axis direction. The terminal electrode 16A is disposed at a position that is near the side of the fixed portion 12 facing in the positive X-axis direction and that is on the negative Y-axis side. The terminal electrode 16B is disposed at a position that is near the side of the fixed portion 12 facing in the positive X-axis direction and that is on the positive Y-axis side. The terminal electrode 16C is disposed at a position that is near the side of the fixed portion 12 facing in the negative X-axis direction and that is on the negative Y-axis side. The terminal electrode 16D is disposed at a position that is near the side of the fixed portion 12 facing in the negative X-axis direction and that is on the positive Y-axis side.

The wiring lines 17A, 17B, 17C, and 17D are disposed on the surface of the fixed portion 12 and the surface of the beam 14, the surfaces facing in the positive Z-axis direction. One end of the wiring line 17A is connected to the terminal electrode 16A, and the other end is connected to the piezoresistor 15A described below. One end of the wiring line 17B is connected to the terminal electrode 16B, and the other end is connected to the piezoresistor 15B described below. One end of the wiring line 17C is connected to the terminal electrode 16C, and the other end is connected to the piezoresistor 15C described below. One end of the wiring line 17D is connected to the terminal electrode 16D, and the other end is connected to the piezoresistor 15D described below. Therefore, the terminal electrode 16A is electrically connected to the piezoresistor 15A through the wiring line 17A; the terminal electrode 16B is electrically connected to the piezoresistor 15B through the wiring line 17B; the terminal electrode 16C is electrically connected to the piezoresistor 15C through the wiring line 17C; and the terminal electrode 16D is electrically connected to the piezoresistor 15D through the wiring line 17D.

Figure 1B:
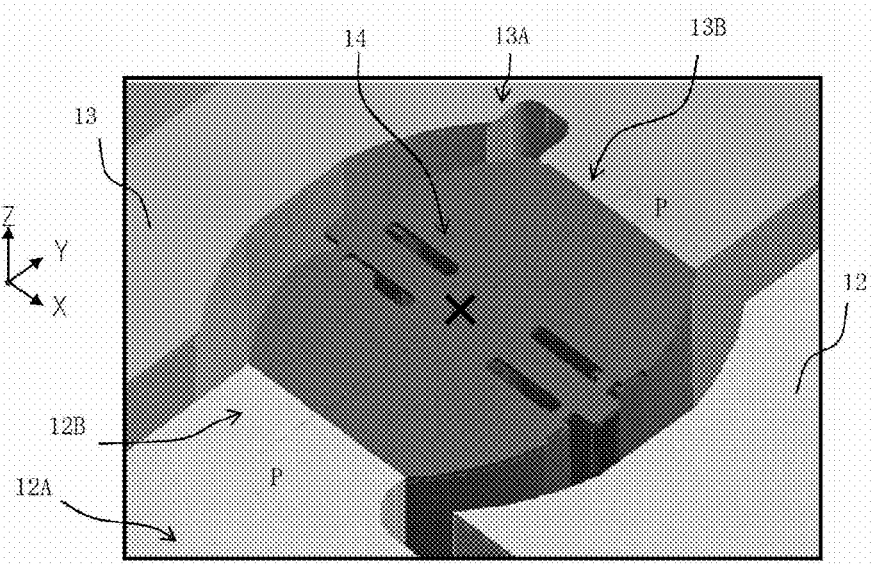

FIG. 1B is a perspective view illustrating the structure of the beam 14 and the surrounding region of the substrate 11.

The center of the beam 14 in the X-Y plane (indicated by "x" in the figure) coincides with the center of mass of the weight 13. The beam 14 is symmetric about a stress neutral plane P. The stress neutral plane P is a plane parallel to the Y-Z plane and passing through the center of the beam 14. When the weight 13 has angular acceleration around the Z-axis, tensile stress and compressive stress generated in the beam 14 balance out along the stress neutral plane P. The beam 14 is also symmetric about a plane parallel to the X-Z plane and passing through the center of the beam 14. As described above, the beam preferably has an elliptical or substantially elliptical shape in the X-Y plane. A side surface of the beam 14 facing in the positive X-axis direction and a side surface of the beam 14 facing in the negative X-axis direction are each convexly arc-shaped. That is, the dimension of the beam 14 in the width direction along the X-axis is the smallest at both ends of the beam 14 in the Y-axis direction and is the largest at the center of the beam 14 in the Y-axis direction.

A connection portion 13B is provided on a surface of the recessed portion 13A to which the beam 14 is connected, that is, a surface of the recessed portion 13A facing in the negative Y-axis direction. The connection portion 13B protrudes toward the beam 14 and is connected to the beam 14.

That is, the recessed portion 13A and the beam 14 are connected to each other through the connection portion 13B. The dimension of the connection portion 13B in the width direction along the X-axis and the dimension of the connection portion 13B in the thickness direction along the Z-axis direction are each uniform or substantially uniform along the Y-axis. The dimension in the width direction and the dimension in the thickness direction of the connection portion 13B are preferably the same or substantially the same as those of an end portion of the beam 14 in the positive Y-axis direction.

A connection portion 12B is provided on a surface of the protruding portion 12A to which the beam 14 is connected, that is, a surface of the protruding portion 12A facing in the positive Y-axis direction. The connection portion 12B protrudes toward the beam 14 and is connected to the beam 14. That is, the protruding portion 12A and the beam 14 are connected to each other through the connection portion 12B. The dimension of the connection portion 12B in the width direction along the X-axis and the dimension of the connection portion 12B in the thickness direction along the Z-axis are uniform or substantially uniform along the Y-axis. The dimension in the width direction and the dimension in the thickness direction of the connection portion 12B are preferably the same or substantially the same as those of an end portion of the beam 14 in the negative Y-axis direction.

As described above, the dimension of the beam 14 in the width direction is larger than that of the connection portion 12B, at which the beam 14 is connected to the fixed portion 12. Therefore, the rigidity of the beam 14 is higher than that of a case where the dimension of the beam 14 in the width direction is uniform. As a result, a high resonant frequency is achieved.

The dimension of the beam 14 in the width direction is larger than that of the connection portion 12B, at which the beam 14 is connected to the fixed portion 12. Therefore, unwanted stress that the fixed portion 12 receives due to the deflection or uneven temperature of the housing (not shown) is not easily transmitted to the beam 14. Accordingly, the amount of unwanted stress transmitted to the piezoresistors 15A to 15D described below can be limited to the minimum. As a result, acceleration or angular acceleration is detected with higher precision, and both a wide detection band and a high S/N ratio are achieved.

A surface of the recessed portion 13A facing a side surface of the beam 14, that is, a portion of the surface of the recessed portion 13A facing in the positive X-axis direction, the portion facing the beam 14, is concavely arc-shaped. When at rest, the beam 14 and the weight 13 are separated from each other by a predetermined distance. A surface of the fixed portion 12 facing a side surface of the beam 14, that is, a portion of the surface of the fixed portion 12 facing in the negative X-axis direction, the portion facing the beam 14, is concavely arc-shaped. When at rest, the beam 14 and the fixed portion 12 are separated from each other by a predetermined distance.

Figure 2:
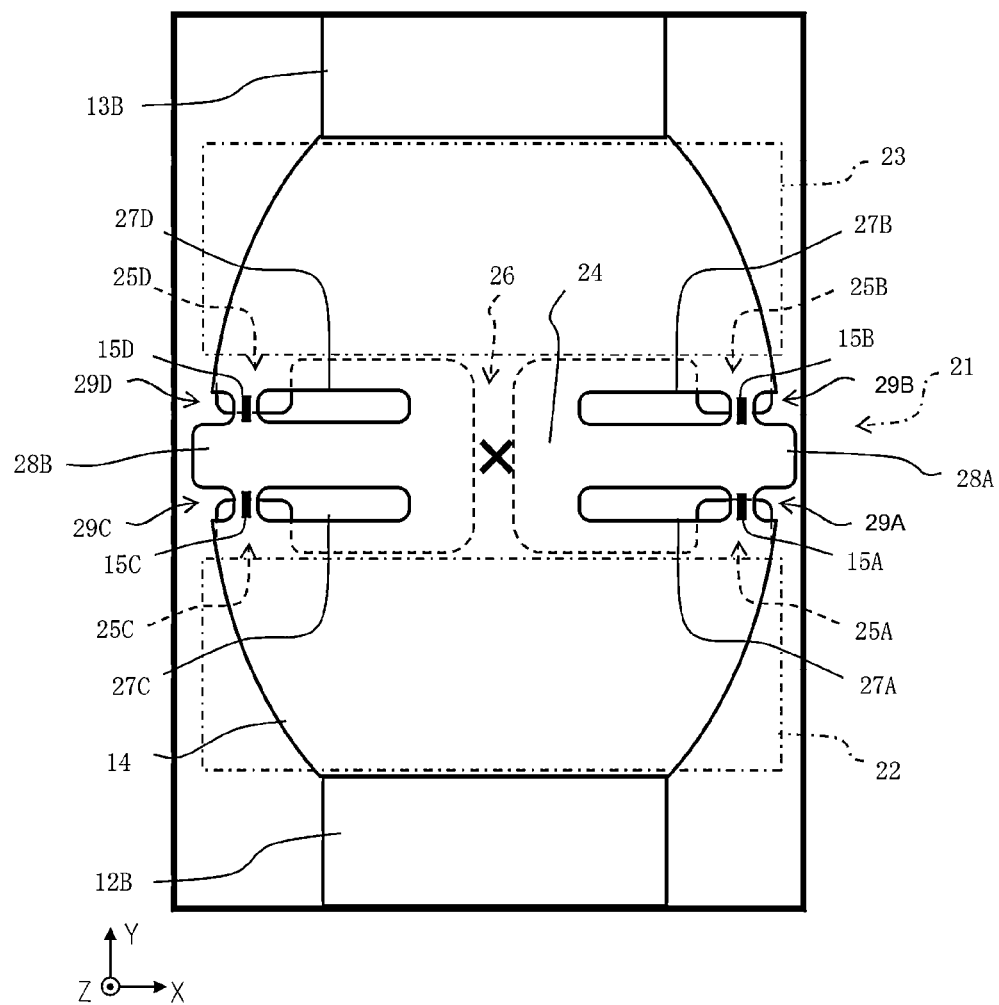
FIG. 2 is a plan view illustrating the structure of a beam and the surrounding region of the angular acceleration sensor according to the first preferred embodiment of the present invention.

FIG. 2 is a plan view of the beam 14.

The beam 14 will be described further in detail. The beam 14 includes a middle portion 21, a fixed-portion-side end portion 22, and a weight-side end portion 23.

The fixed-portion-side end portion 22 is located near an end of the beam 14 in the negative Y-axis direction. The fixed-portion-side end portion 22 is connected to the fixed portion 12 at the connection portion 12B. The dimension of the fixed-portion-side end portion 22 in the thickness direction along the Z-axis coincides with that of the connection portion 12B. The weight-side end portion 23 is located near an end of the beam 14 in the positive Y-axis direction. The weight-side end portion 23 is connected to the weight 13 at the connection portion 13B. The dimension of the weight-side end portion 23 in the thickness direction along the Z-axis coincides with that of the connection portion 13B. The middle portion 21 is disposed between and connected to the fixed-portion-side end portion 22 and the weight-side end portion 23. The middle portion 21 includes a planar portion 24 and thickness-direction protrusions 25A, 25B, 25C, 25D, and 26.

The planar portion 24 is preferably formed from the SOI layer 11A described above. The planar portion 24 has a planar shape having an extension direction along the Y-axis, a width direction along the X-axis, and a thickness direction along the Z-axis. In the X-Y plane, the planar portion 24 occupies substantially the entire area of the middle portion 21. An end portion of the planar portion 24 in the negative Y-axis direction is connected to the fixed-portion-side end portion 22. An end portion of the planar portion 24 in the positive Y-axis direction is connected to the weight-side end portion 23.

The thickness-direction protrusions 25A, 25B, 25C, 25D, and 26 are defined by the base layer 11B described above and disposed in specific areas of the middle portion 21 in the X-Y plane. The thickness-direction protrusion 26 preferably has a rectangular or substantially rectangular parallelepiped shape having an extension direction along the Y-axis, a width direction along the X-axis, and a thickness direction along the Z-axis. The thickness-direction protrusion 26 protrudes in the negative Z-axis direction from a surface of the planar portion facing in the negative Z-axis direction. The thickness-direction protrusion 26 is disposed at the center, in the X-axis direction, of the surface of the planar portion 24 facing in the negative Z-axis direction. The thickness-direction protrusion 26 extends along the Y-axis and passes through the center of the beam 14 in the X-Y plane. An end portion of the thickness-direction protrusion 26 in the negative Y-axis direction is connected to the fixed-portion-side end portion 22. An end portion of the thickness-direction protrusion 26 in the positive Y-axis direction is connected to the weight-side end portion 23.

The thickness-direction protrusions 25A to 25D each preferably have a rectangular or substantially rectangular parallelepiped shape having an extension direction along the Y-axis, a width direction along the X-axis, and a thickness direction along the Z-axis. The thickness-direction protrusions 25A to 25D each protrude in the negative Z-axis direction from the surface of the planar portion 24 facing in the negative Z-axis direction.

The thickness-direction protrusion 25A is disposed along the Y-axis near an end of the beam 14 in the positive X-axis direction. An end portion of the thickness-direction protrusion 25A in the negative Y-axis direction is connected to the fixed-portion-side end portion 22. The thickness-direction protrusion 25B is disposed along the Y-axis near the end of the beam 14 in the positive X-axis direction. An end portion of the thickness-direction protrusion 25B in the positive Y-axis direction is connected to the weight-side end portion 23. An end portion of the thickness-direction protrusion 25A in the positive Y-axis direction and an end portion of the thickness-direction protrusion 25B in the negative Y-axis direction face each other with a distance therebetween along the Y-axis at a position near the end of the beam 14 in the positive X-axis direction.

The thickness-direction protrusion 25C is disposed along the Y-axis near an end of the beam 14 in the negative X-axis direction. An end portion of the thickness-direction protrusion 25C in the negative Y-axis direction is connected to the fixed-portion-side end portion 22. The thickness-direction protrusion 25D is disposed along the Y-axis near the end of the beam 14 in the negative X-axis direction. An end portion of the thickness-direction protrusion 25D in the positive Y-axis direction is connected to the weight-side end portion 23. An end portion of the thickness-direction protrusion 25C in the positive Y-axis direction and an end portion of the thickness-direction protrusion 25D in the negative Y-axis direction face each other with a distance therebetween along the Y-axis at a position near the end of the beam 14 in the negative X-axis direction.

The beam 14, which has the shape described above, can be easily formed preferably by using an SOI substrate as the substrate 11. To be specific, an insulator layer disposed between the SOI layer 11A and the base layer 11B of the SOI substrate is preferably used as an etching stop layer. By using the etching stop layer, a step of etching the SOI layer 11A, a step of reversing the SOI substrate, and a step of etching the base layer 11B are performed. Thus, the beam 14 is manufactured through a small number of steps.

As described above, the middle portion 21 includes the planar portion 24. Therefore, the flexural rigidity of the middle portion 21 in the X-axis direction, which is a direction parallel to the planar surface and perpendicular to the extension direction, is sufficiently lower than that of each of the fixed-portion-side end portion 22, the weight-side end portion 23, and the connection portions 12B and 13B. Accordingly, deflection and stress are concentrated on the middle portion 21 than on any of the fixed-portion-side end portion 22, the weight-side end portion 23, and the connection portions 12B and 13B. That is, deflection in the Y-axis direction occurs only in the middle portion 21 and is hardly likely to occur in the fixed-portion-side end portion 22, the weight-side end portion 23, and the connection portions 12B and 13B.

The middle portion 21 includes the thickness-direction protrusions 25A to 25D and 26. Therefore, the rigidities of regions of the planar portion 24 of the middle portion 21 overlapping the thickness-direction protrusions 25A to 25D and 26 in the Z-axis direction are high, and deflection and stress hardly occur in these regions. Deflection and stress are easily concentrated on a region located between the thickness-direction protrusion 25A and the thickness-direction protrusion 25B in the Y-axis direction and on a region located between the thickness-direction protrusion 25C and the thickness-direction protrusion 25D in the Y-axis direction.

The planar portion 24 includes through-holes 27A, 27B, 27C, and 27D; width-direction protrusions 28A and 28B; and width-direction recesses 29A, 29B, 29C, and 29D.

The through-holes 27A to 27D are formed preferably by etching the SOI layer 11A described above. The through-holes 27A to 27D, each extending through the planar portion 24 in the Z-axis direction, each have an opening in a surface of the planar portion 24 facing in the positive Z-axis direction and an opening in the surface of the planar portion 24 facing in the negative Z-axis direction. The through-holes 27A to 27D each have a transversal direction along the Y-axis and a longitudinal direction along the X-axis.

The through-hole 27A extends in the negative X-axis direction from a position overlapping that of the end portion of the thickness-direction protrusion 25A in the positive Y-axis direction. The through-hole 27B extends in the negative X-axis direction from a position overlapping that of the end portion of the thickness-direction protrusion 25B in the negative Y-axis direction. The position of an end of the through-hole 27A in the positive Y-axis direction and the position of an end of the through-hole 27B in the negative Y-axis direction are separated from each other in the Y-axis direction and coincide with each other in the X-axis direction.

The through-hole 27C extends in the positive X-axis direction from a position overlapping that of the end portion of the thickness-direction protrusion 25C in the positive Y-axis direction. The through-hole 27D extends in the positive X-axis direction from a position overlapping that of the end portion of the thickness-direction protrusion 25D in the negative Y-axis direction. The position of an end of the through-hole 27C in the positive Y-axis direction and the position of an end of the through-hole 27D in the negative Y-axis direction are separated from each other in the Y-axis direction and coincide with each other in the X-axis direction.

The position of an end of the through-hole 27A in the negative X-axis direction and the position of an end of the through-hole 27C in the positive X-axis direction are separated from each other in the X-axis direction and coincide with each other in the Y-axis direction. The position of an end of the through-hole 27B in the negative X-axis direction and the position of an end of the through-hole 27D in the positive X-axis direction are separated from each other in the X-axis direction and coincide with each other in the Y-axis direction.

The width-direction protrusion 28A is disposed on the positive X-axis side of the center of the beam 14 and protrudes in the positive X-axis direction from a side surface of the planar portion 24 facing in the positive X-axis direction. The width-direction recess 29A is disposed adjacent to negative Y-axis side of the width-direction protrusion 28A. The width-direction recess 29A is recessed in the negative X-axis direction in the side surface of the planar portion 24 facing in the positive X-axis direction. The width-direction recess 29B is disposed adjacent to the positive Y-axis side of the width-direction protrusion 28A. The width-direction recess 29B is recessed in the negative X-axis direction in the side surface of the planar portion 24 facing in the positive X-axis direction. That is, the width-direction protrusion 28A is disposed between the width-direction recess 29A and the width-direction recess 29B.

The width-direction protrusion 28B is disposed on the negative X-axis side of the center of the beam 14 and protrudes in the negative X-axis direction from a side surface of the planar portion 24 facing in the negative X-axis direction. The width-direction recess 29C is disposed adjacent to the negative Y-axis side of the width-direction protrusion 28B. The width-direction recess 29C is recessed in the positive X-axis direction in the side surface of the planar portion 24 facing in the negative X-axis direction. The width-direction recess 29D is disposed adjacent to the positive Y-axis side of the width-direction protrusion 28B. The width-direction recess 29D is recessed in the positive X-axis direction in the side surface of the planar portion 24 facing in the negative X-axis direction. That is, the width-direction protrusion 28B is disposed between the width-direction recess 29C and the width-direction recess 29D.

The position of an end of the width-direction recess 29A in the negative X-axis direction and the position of an end of the through-hole 27A in the positive X-axis direction are separated from each other in the X-axis direction and coincide with each other in the Y-axis direction. The position of an end of the width-direction recess 29B in the negative X-axis direction and the position of an end of the through-hole 27B in the positive X-axis direction are separated from each other in the X-axis direction and coincide with each other in the Y-axis direction.

The position of an end of the width-direction recess 29C in the positive X-axis direction and the position of an end of the through-hole 27C in the negative X-axis direction are separated from each other in the X-axis direction and coincide with each other in the Y-axis direction. The position of an end of the width-direction recess 29D in the positive X-axis direction and the position of an end of the through-hole 27D in the negative X-axis direction are separated from each other in the X-axis direction and coincide with each other in the Y-axis direction.

As described above, the planar portion 24 includes the through-holes 27A to 27D and the width-direction recesses 29A to 29D. Therefore, the rigidities of regions of the planar portion 24 in which the through-holes 27A to 27D and the width-direction recesses 29A to 29D are disposed are low, and deflection and stress can be easily concentrated on these regions. In particular, the rigidities of regions of the planar portion 24 located between the through-holes 27A to 27D and the width-direction recesses 29A to 29D in the X-axis direction are considerably low, and deflection and stress are easily concentrated on these regions.

The planar portion 24 includes the width-direction protrusions 28A and 28B. Therefore, the rigidity of a region of the planar portion 24 located in the X-axis direction from the width-direction protrusions 28A and 28B is high. Accordingly, deflection and stress are easily concentrated on regions displaced from the width-direction protrusions 28A and 28B in the Y-axis direction.

Figure 3A:
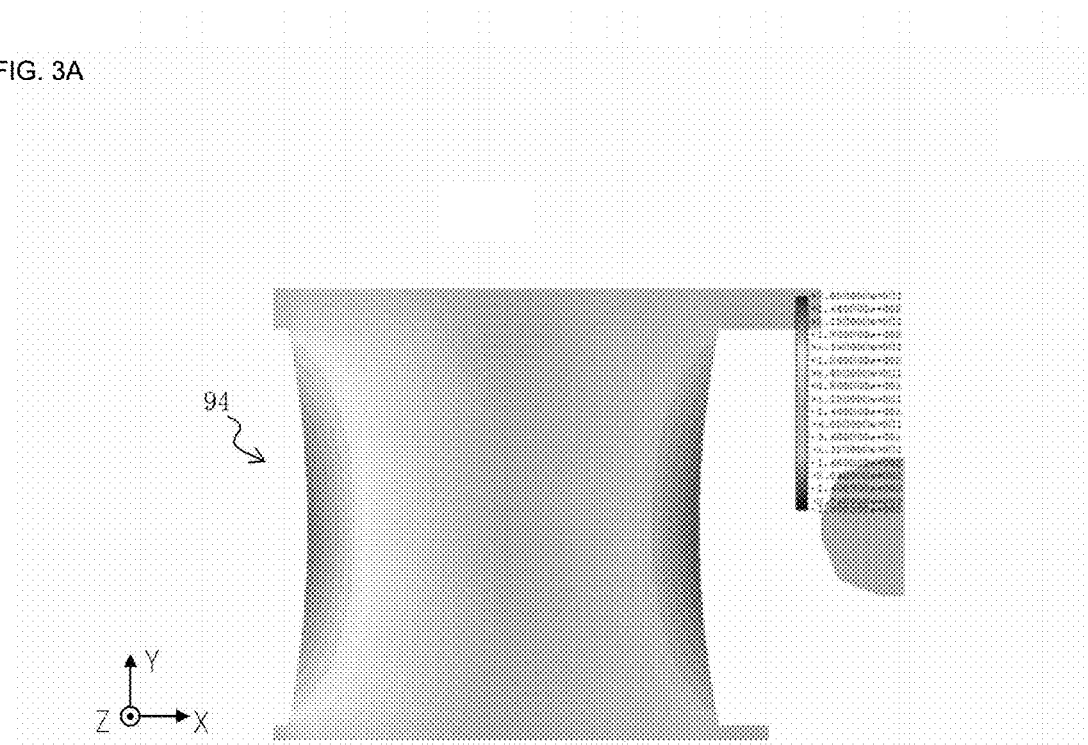
FIGS. 3A and 3B are contour figures illustrating examples of deflection stress acting on beams.
Figure 3B:
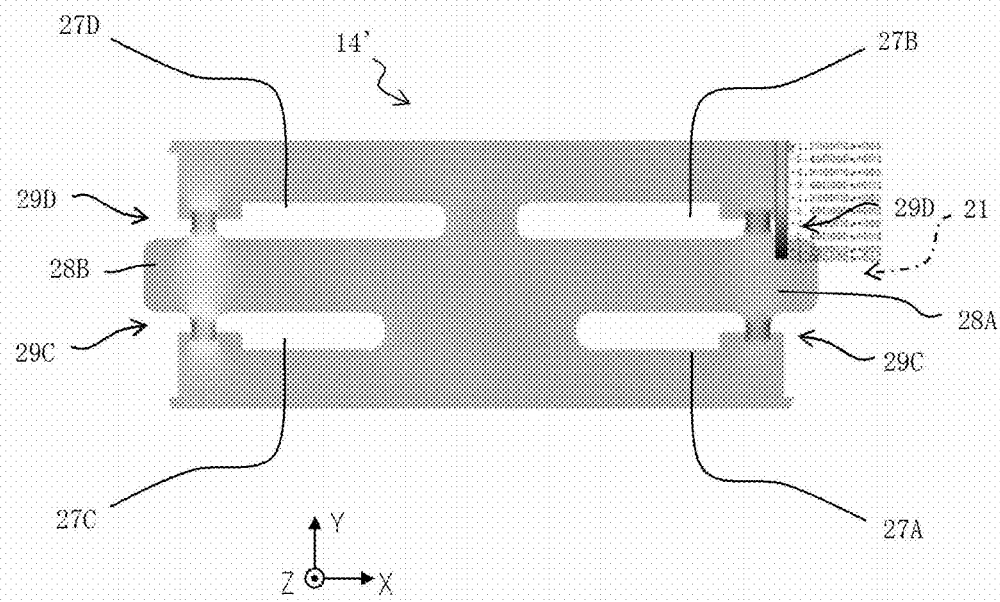

FIG. 3 shows contour figures illustrating examples of deflection stress acting on beams. FIG. 3A illustrates deflection stress in a beam 94 according to a comparative example, which has a simple rectangular shape. FIG. 3B illustrates deflection stress in a beam 14', which has substantially the same structure as the present preferred embodiment except for the dimensions and the like.

In the beam 94 according to the comparative example, stress is concentrated on a region near a side surface of the beam 94 facing in the positive X-axis direction and in a region near a side surface of the beam 94 facing in the negative X-axis direction. In each of the regions near the side surfaces, stress is distributed over the entire length of the beam 94 and the stress is the largest at the center in the Y-axis direction.

In the beam 14' according to the present preferred embodiment, stress is concentrated on regions near an end of the middle portion 21 in the positive X-axis direction and on regions near an end of the middle portion 21 in the negative X-axis direction. In particular, large stress is concentrated on very small regions that are displaced from the width-direction protrusions 28A and 28B in the Y-axis direction and that are located between the through-holes 27A to 27D and the width-direction recesses 29A to 29D in the X-axis direction.

Accordingly, as illustrated in FIG. 2, the piezoresistors 15A to 15D, which are examples of detection elements, are disposed in regions that are displaced from the width-direction protrusions 28A and 28B in the Y-axis position and that are located between the through-holes 27A to 27D and the width-direction recesses 29A to 29D in the X-axis direction. With this structure, large stress is detected, angular acceleration is detected with high sensitivity, and both a wide detection band and a high S/N ratio are achieved.

Next, the reason why a high S/N ratio and a high resonant frequency are achieved by forming the through-holes 27A to 27D in the angular acceleration sensor 10 will be described by using mathematical expressions.

In general, the natural frequency of the substrate 11 can be represented by the following expression.

$$f_0 = \frac{1}{2\pi}\sqrt{\frac{EI_{BX}}{I\lambda}}$$ Mathematical Expression 1

E: Young's modulus of the material of the beam
$I_{BX}$: moment of inertia of area of the beam
I: flexural moment applied by the weight to the beam
$\lambda$: effective length of the beam The stress of the beam 14 can be represented by the following expression.

$$\sigma = \frac{yI\beta}{I_{BX}}$$ Mathematical Expression 2 y: distance from the stress neutral plane of the beam to the piezoresistors
$\beta$: input angular acceleration The sensitivity of the angular acceleration sensor 10 is proportional to the stress acting on the piezoresistor and can be represented by the following expression by using a tentative proportionality constant. In practice, as the tentative proportionality constant, various parameters, such as the piezoresistor coefficient, the sensor drive voltage, the structure of the detection circuit, and the wiring line loss, can be used.

$$S\beta = k_1\sigma = \frac{k_1 yI\beta}{I_{BX}}$$ Mathematical Expression 3

$$\therefore S = \frac{k_1 yI}{I_{BX}}$$

$k_1$: proportionality constant
S: sensitivity

A high S/N ratio and a high resonant frequency of the angular acceleration sensor 10 are achieved by designing the angular acceleration sensor 10 so as to satisfy a mathematical condition that the product of the sensitivity and the natural frequency is increased. In this case, in order to realize a high S/N ratio and a high resonant frequency, it is necessary to increase the value of the following expression.

$$f_0 \cdot S = \frac{k_1 y}{2\pi}\sqrt{\frac{IE}{I_{BX}\lambda}}$$ Mathematical Expression 4

That is, it is effective to increase parameters dependent on the structure of the angular acceleration sensor 10, which are the distance from the stress neutral plane of the beam to the stress detection positions, the reciprocal of the square root of the moment of inertial of area of the beam 14, and the reciprocal of the square root of the effective length of the beam 14.

Here, how to increase the product z of the distance from the stress neutral plane of the beam 14 to the stress detection positions and the reciprocal of the square root of the moment of inertial of area of the beam 14 will be examined. The product z is represented by the following expression.

$$z = y/\sqrt{I_{BX}} \qquad \text{Mathematical Expression 5}$$

Figure 4:
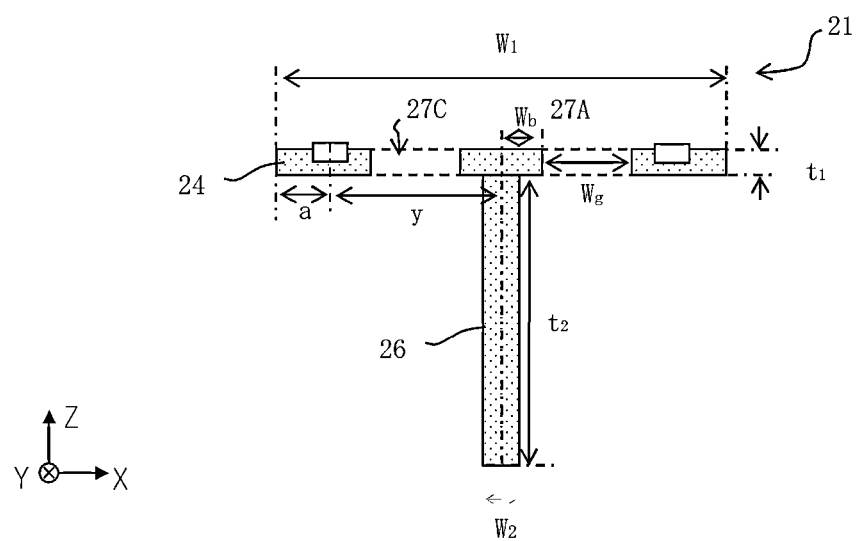
FIG. 4 is a sectional view illustrating the dimensions of the beam.

The distance from the stress neutral plane of the beam 14 to the piezoresistors 15A to 15D can be represented by the following expression. FIG. 4 is a sectional view of the middle portion 21 of the beam 14, showing the dimensions of portions of the middle portion 21. In the following expression, a is the distance from an end of the beam 14 to the piezoresistors 15A to 15D, which is determined in accordance with the process rule.

$$y = \frac{w_1}{2} - \alpha \qquad \text{Mathematical Expression 6}$$

If the beam 14 does not have the through-holes 27A to 27D, the moment of inertial of area of the beam 14 is represented by the following expression.

$$I_{B1} = \frac{t_1 w_1^3 + t_2 w_2^3}{12} \qquad \text{Mathematical Expression 7}$$

If the beam 14 has the through-holes 27A to 27D, the moment of inertial of area of the beam 14 is represented by the following expression.

$$I_{B2} = \frac{t_1 \{w_1^3 - k_2\} + t_2 w_2^3}{12} \qquad \text{Mathematical Expression 8}$$
$$k_2 = 3w_g w_b^2 + 3w_g^2 w_b + w_g^3$$

In Mathematical Expression 8, the constant $k_2$ is subtracted from the cube of the total width $w_1$ of the beam 14 in Mathematical Expression 7. Accordingly, if the beam 14 has the through-holes 27A to 27D, the following relationship is always satisfied.

$$I_{B1} > I_{B2} \qquad \text{Mathematical Expression 9}$$

Therefore, the product z which is represented by Mathematical Expression 5 including the moment of inertial of area of the beam 14, for the present preferred embodiment, which has the through-holes 27A to 27D, is assuredly larger than that for existing structures, which do not have the through-holes 27A to 27D.

Accordingly, the product $f_0 \times S$ of the resonant frequency and the sensitivity represented by Mathematical Expression 4, for the present preferred embodiment, which has the through-holes 27A to 27D, is assuredly larger than that for existing structures, which do not have the through-holes 27A to 27D. As a result, both a high S/N ratio and a high resonant frequency are achieved.

Next, angular acceleration sensors according to modifications of the first preferred embodiment will be described.

Figure 5A:
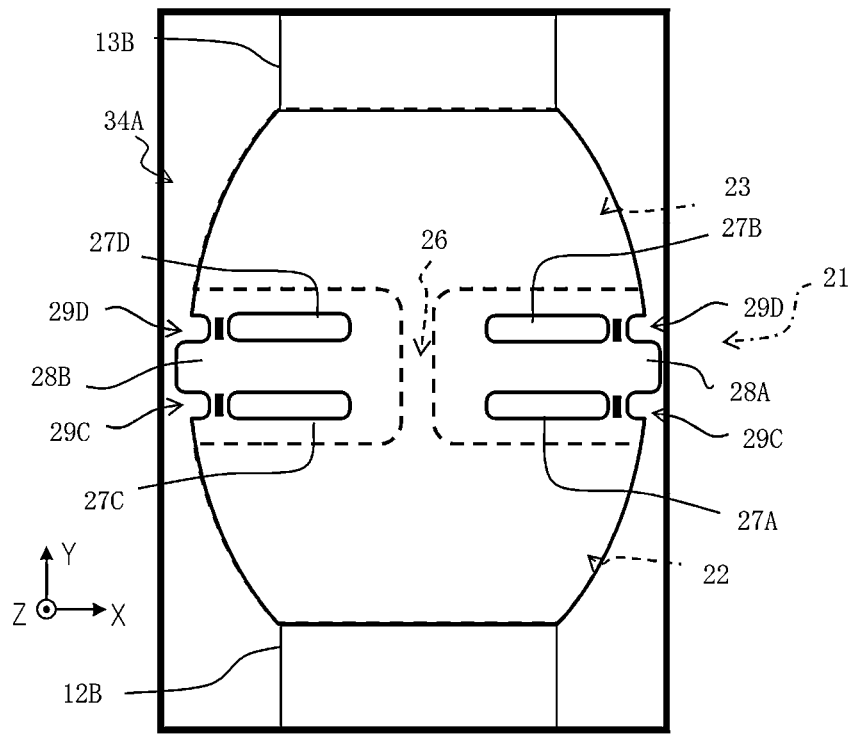
FIGS. 5A and 5B are plan views of modifications of the beam.

FIG. 5A is an X-Y plane plan view illustrating a beam 34A and the surrounding region according to a first modification. The beam 34A according to the first modification does not include the thickness-direction protrusions 25A to 25D. As in this case, the angular acceleration sensor 10 according to the first preferred embodiment need not include the thickness-direction protrusions 25A to 25D.

Figure 5B:
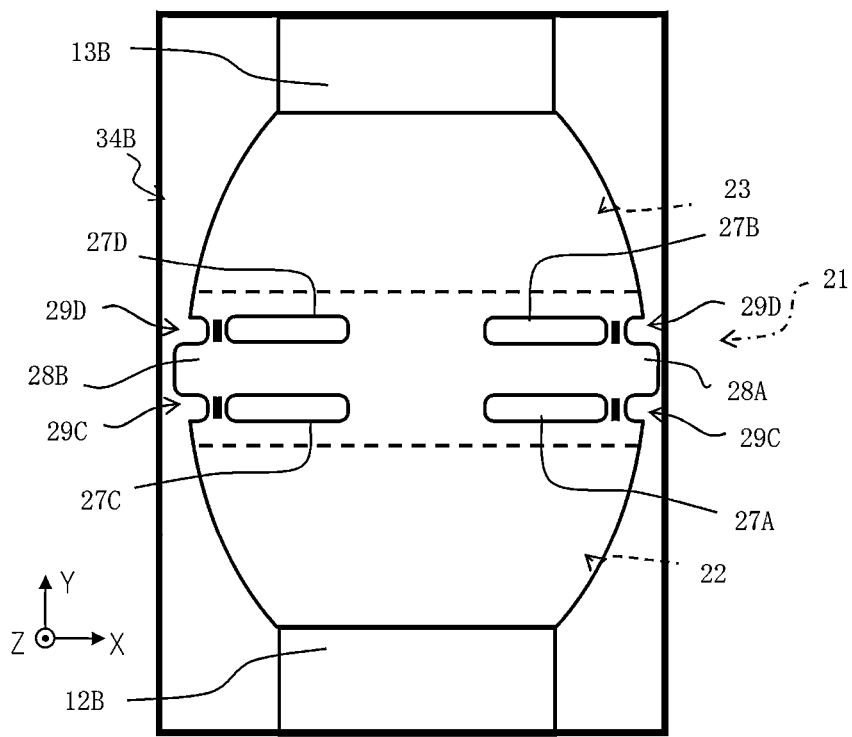

FIG. 5B is an X-Y plane plan view illustrating a beam 34B and the surrounding region according to a second modification. The beam 34B according to the second modification does not include the thickness-direction protrusions 25A to 25D and the thickness-direction protrusion 26. As in this case, the angular acceleration sensor 10 according to the first preferred embodiment need not include the thickness-direction protrusion 26.

Figure 6A:
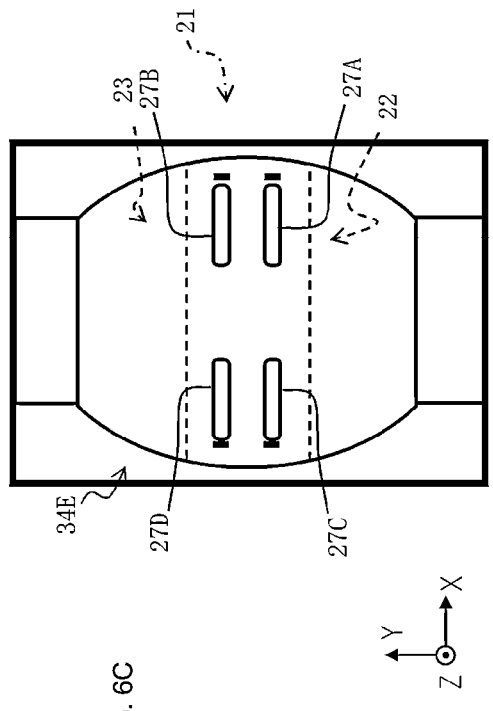
FIGS. 6A-6D are plan views of modifications of the beam.

FIG. 6A is an X-Y plane plan view illustrating a beam 34C and the surrounding region according to a third modification. The beam 34C according to the third modification preferably has a rectangular or substantially rectangular shape in the X-Y plane. The beam 34C does not include the thickness-direction protrusions 25A to 25D and 26, the width-direction protrusions 28A and 28B, and the width-direction recesses 29A to 29D. As in this case, the angular acceleration sensor 10 according to the first preferred embodiment may have a rectangular or substantially rectangular shape in the X-Y plane. Moreover, the angular acceleration sensor 10 according to the first preferred embodiment need not include the width-direction protrusions 28A and 28B and the width-direction recesses 29A to 29D.

Figure 6B:
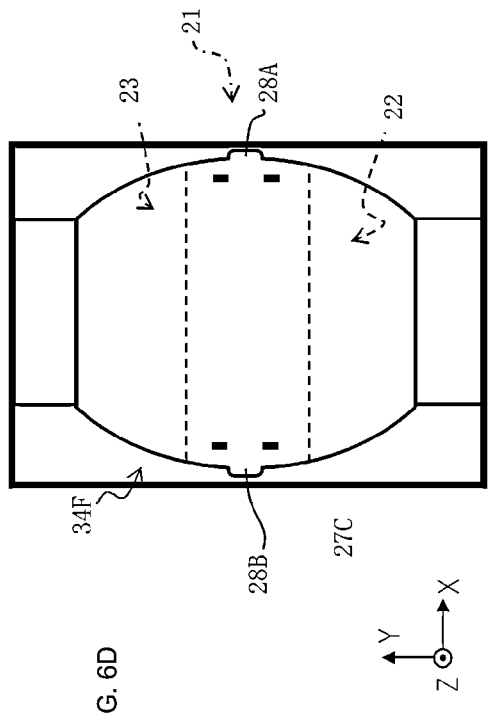

FIG. 6B is an X-Y plane plan view illustrating a beam 34D and the surrounding region according to a fourth modification. The beam 34D according to the fourth modification preferably has a rectangular or substantially rectangular shape in the X-Y plane. The beam 34D does not include the thickness-direction protrusions 25A to 25D and 26, the through-holes 27A to 27D, and the width-direction recesses 29A to 29D. As in this case, the angular acceleration sensor 10 according to the first preferred embodiment need not include the through-holes 27A to 27D.

Figure 6C:
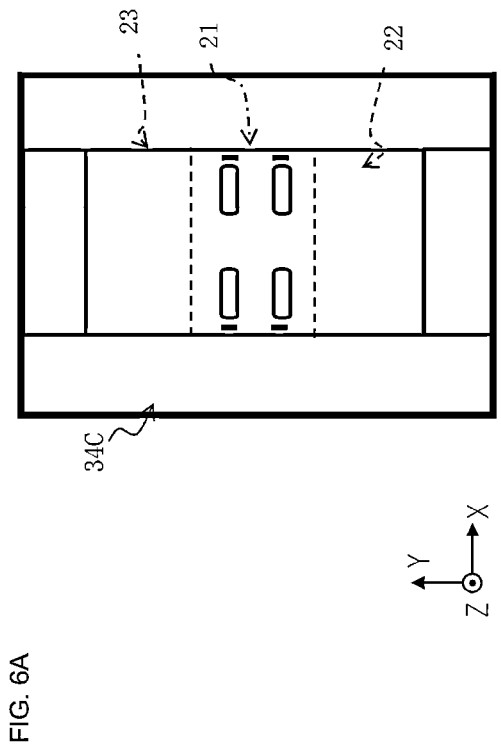

FIG. 6C is an X-Y plane plan view illustrating a beam 34E and the surrounding region according to a fifth modification. The beam 34E according to the fifth modification has an elliptical or substantially elliptical shape in the X-Y plane. The beam 34E does not include the thickness-direction protrusions 25A to 25D and 26, the width-direction protrusions 28A and 28B, and the width-direction recesses 29A to 29D.

Figure 6D:
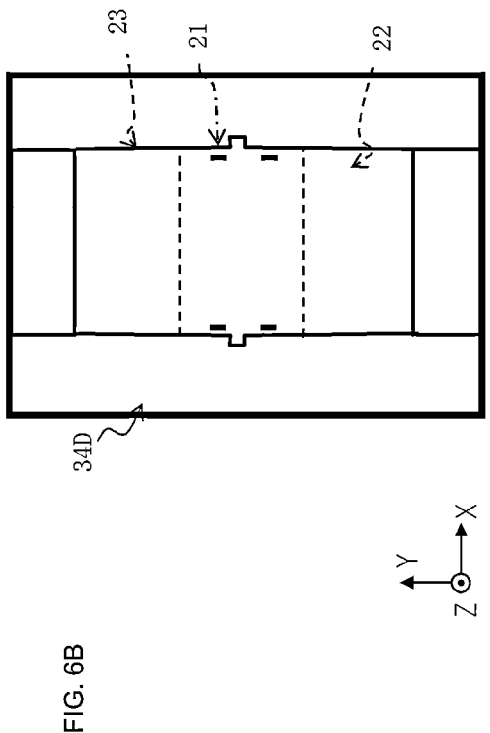

FIG. 6D is an X-Y plane plan view of a beam 34F and the surrounding region according to a sixth modification. The beam 34F according to the sixth modification has an elliptical or substantially elliptical shape in the X-Y plane. The beam 34F does not include the thickness-direction protrusions 25A to 25D and 26, the through-holes 27A to 27D, and the width-direction recesses 29A to 29D.

As in the above modifications, the shape of a beam according to the present preferred embodiment may be modified in various ways as long as the beam includes the width-direction protrusions 28A and 28B or the through-holes 27A to 27D. The external shape of the beam may be modified in various ways as long as the dimension of the beam in the width direction is larger than that of the connection portion 12B. The positions, the shapes, and the numbers of the width-direction protrusions and the through-holes may be changed in various ways.

A generally used circuit structure may be used as the circuit structure of an angular acceleration detection circuit including a piezoresistor. Although the details are omitted here, preferably, the angular acceleration detection circuit is, for example, a Wheatstone bridge circuit including four piezoresistors.

Second Preferred Embodiment

Hereinafter, an acceleration sensor 50 according to a second preferred embodiment of the present invention will be described. The angular acceleration sensor according to the first preferred embodiment detects angular acceleration. The acceleration censor according to the present preferred embodiment detects acceleration, instead of angular acceleration.

Figure 7A:
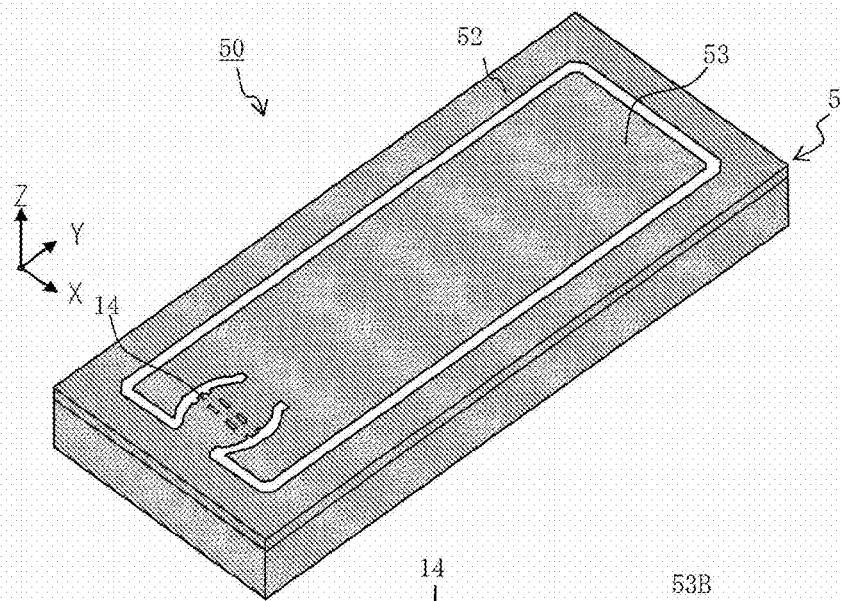
FIGS. 7A and 7B are perspective views of an angular acceleration sensor according to a second preferred embodiment.
Figure 7B:
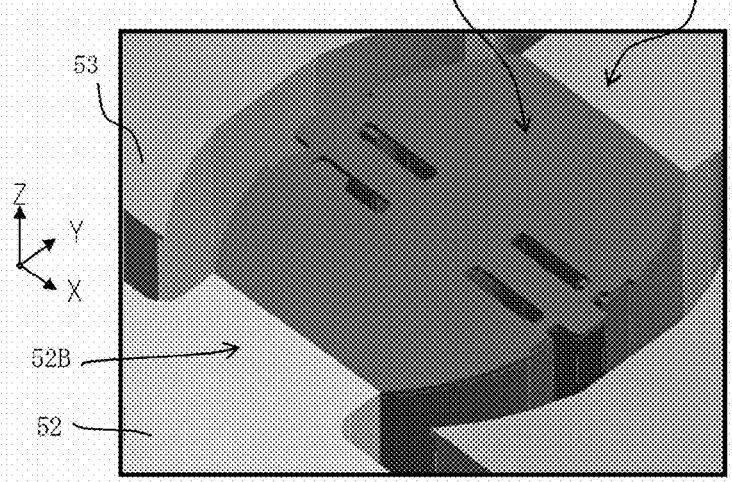
Figure 8:
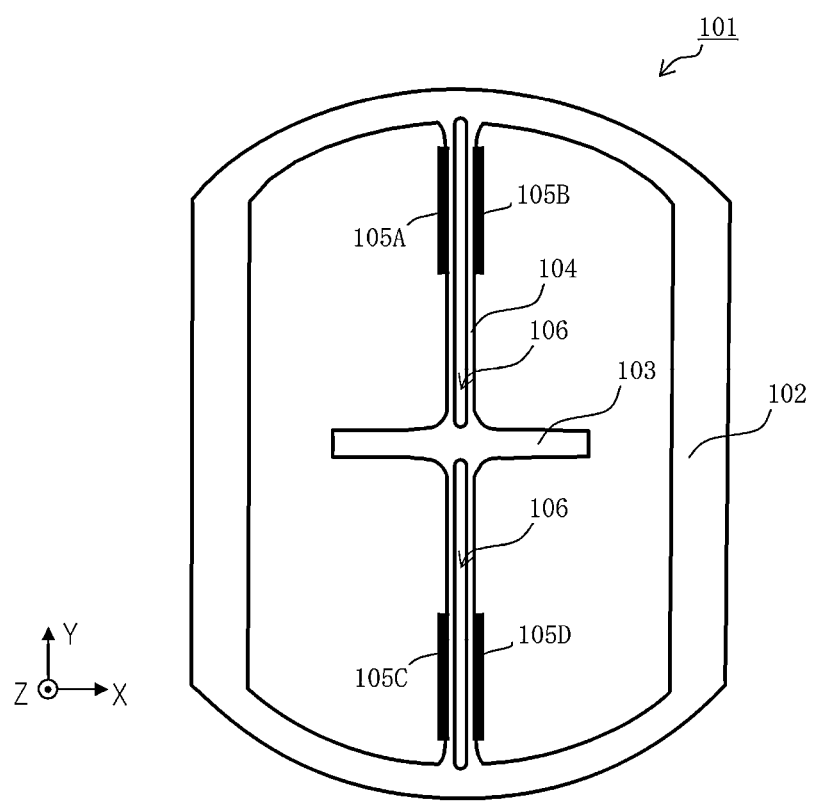
FIG. 8 illustrates an existing angular acceleration sensor.

FIG. 7A is a perspective view of the acceleration sensor 50.

The acceleration sensor 50 includes a substrate 51. Piezoresistors, terminal electrodes, and wiring lines are not illustrated in the figure.

The substrate 51 preferably has a rectangular or substantially rectangular planar shape having a longitudinal direction along the Y-axis, a transverse direction along the X-axis, and a thickness direction along the Z-axis. The substrate 51 has an opening that extends therethrough between two surfaces of the substrate 51 that face each other in the Z-axis direction. Due to the presence of the opening, the substrate 51 is divided into a fixed portion 52, a weight 53, and a beam 14. The beam 14 preferably is the same as that of the first preferred embodiment.

In the X-Y plane, the fixed portion 52 is disposed in an outer peripheral portion of the substrate 51 so as to have a frame shape that surrounds the weight 53 and the beam 14. The beam 14 is connected to the fixed portion 52 at an end thereof in the negative Y-axis direction and is connected to the weight 53 at an end thereof in the positive Y-axis direction. In the X-Y plane, the weight 53 has a transverse direction along the X-axis and a longitudinal direction along the Y-axis. The weight 53 is displaceably supported by the fixed portion 52 through the beam 14.

To be specific, in the X-Y plane, a central portion of a side of the weight 53 facing in the negative Y-axis direction is recessed in the positive Y-axis direction, and the beam 14 is disposed in the recessed portion. The fixed portion 52 includes an inner wall that has a rectangular or substantially rectangular shape in the X-Y plane. The beam 14 extends in the positive Y-axis direction from a central portion of a wall of the fixed portion 52 facing in the positive Y-axis direction and is connected to a wall inside the recessed portion of the weight 53 facing in the negative Y-axis direction.

A preferred embodiment of the present invention can be appropriately configured to have such a structure. An acceleration sensor differs from an angular acceleration sensor in that the acceleration sensor has a higher sensitivity as the center of mass of the weight is located farther from the beam.

A generally used circuit structure may be used as the circuit structure of an acceleration detection circuit including a piezoresistor. Although the details are omitted here, preferably, the angular acceleration detection circuit is, for example, a Wheatstone bridge circuit including four piezoresistors.

An angular acceleration sensor and an acceleration sensor according to the present invention are achieved by using the structures of preferred embodiments described above. The present invention can be embodied in various preferred embodiments other than those described above.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An angular acceleration sensor comprising:
a planar surface;
a fixed portion;
a weight supported by the fixed portion;
a beam extending in an extension direction along the planar surface and connected to the fixed portion and the weight; and
a detection element disposed in the beam and detecting stress due to deflection of the beam along the planar surface; wherein
a dimension of the beam in a width direction, which is a direction parallel or substantially parallel to the planar surface and perpendicular or substantially perpendicular to an extension direction, is larger than a dimension, in the width direction, of a connection portion at which the beam is connected to the fixed portion;
the detection element is disposed in a portion of the beam other than edge portions of the beam in the extension direction;
the portion of the beam includes the dimension in the width direction that is larger than the dimension of the connection portion in the width direction;
the beam includes a width-direction protrusion protruding in the width direction; and
a position of the detection element in the extension direction is displaced from that of the width-direction protrusion.

2. The angular acceleration sensor according to claim 1, wherein the beam includes:
a fixed-portion-side end portion connected to the fixed portion;
a weight-side end portion connected to the weight; and
a planar portion disposed between and connected to the fixed-portion-side end portion and the weight-side end portion, the planar portion having a dimension in a thickness direction that is smaller than a dimension in the thickness direction of each of the fixed-portion-side end portion and the weight-side end portion, the thickness direction being a direction perpendicular or substantially perpendicular to the planar surface; and
the detection element is disposed in the planar portion.

3. The angular acceleration sensor according to claim 2, wherein a dimension of the planar portion in the width direction is larger than a dimension of the fixed-portion-side end portion in the width direction.

4. The angular acceleration sensor according to claim 1, wherein
the weight includes a recessed portion recessed in the width direction;
the fixed portion includes a protruding portion protruding in the width direction and facing the recessed portion; and
the beam is connected to the protruding portion and the recessed portion at positions near a center of mass of the weight.

5. An angular acceleration sensor comprising:
a planar surface;
a fixed portion;
a weight supported by only one connecting point of the fixed portion;
a beam extending along the planar surface and connected to the fixed portion and the weight; and
a detection element disposed in the beam and detecting stress due to deflection of the beam along the planar surface; wherein
the beam includes a through-hole extending therethrough in a thickness direction that is perpendicular or substantially perpendicular to the planar surface;
a position of the detection element in the extension direction overlaps that of the through-hole; and a dimension of the beam in the width direction, which is a direction parallel or substantially parallel to the planar surface and perpendicular or substantially perpendicular to the extension direction, is larger than a dimension, in the width direction, of a connection portion at which the beam is connected to the fixed portion.

6. The angular acceleration sensor according to claim 5, wherein
the beam includes a width-direction protrusion protruding in the width direction; and
the position of the detection element in the extension direction is displaced from that of the width-direction protrusion.

7. The angular acceleration sensor according to claim 5, wherein the beam includes:
a fixed-portion-side end portion connected to the fixed portion;
a weight-side end portion connected to the weight; and
a planar portion disposed between and connected to the fixed-portion-side end portion and the weight-side end portion, the planar portion having a dimension in a thickness direction that is smaller than a dimension in the thickness direction of each of the fixed-portion-side end portion and the weight-side end portion, the thickness direction being a direction perpendicular or substantially perpendicular to the planar surface; and
the detection element is disposed in the planar portion.

8. The angular acceleration sensor according to claim 7, wherein a dimension of the planar portion in the width direction is larger than a dimension of the fixed-portion-side end portion in the width direction.

9. The angular acceleration sensor according to claim 5, wherein
the weight includes a recessed portion recessed in the width direction;
the fixed portion includes a protruding portion protruding in the width direction and facing the recessed portion; and
the beam is connected to the protruding portion and the recessed portion at positions near a center of mass of the weight.

10. An acceleration sensor comprising:
a planar surface;
a fixed portion;
a weight supported by the fixed portion;
a beam extending in an extension direction along the planar surface and connected to the fixed portion and the weight; and
a detection element disposed in the beam and detecting stress due to deflection of the beam along the planar surface; wherein
a dimension of the beam in a width direction, which is a direction parallel or substantially parallel to the planar surface and perpendicular or substantially perpendicular to an extension direction, is larger than a dimension, in the width direction, of a connection portion at which the beam is connected to the fixed portion;
the detection element is disposed in a portion of the beam other than edge portions of the beam in the extension direction;
the portion of the beam includes the dimension in the width direction that is larger than the dimension of the connection portion in the width direction;
the beam includes a width-direction protrusion protruding in the width direction; and
a position of the detection element in the extension direction is displaced from that of the width-direction protrusion.

11. The acceleration sensor according to claim 10, wherein the beam includes:
a fixed-portion-side end portion connected to the fixed portion;
a weight-side end portion connected to the weight; and
a planar portion disposed between and connected to the fixed-portion-side end portion and the weight-side end portion, the planar portion having a dimension in a thickness direction that is smaller than a dimension in the thickness direction of each of the fixed-portion-side end portion and the weight-side end portion, the thickness direction being a direction perpendicular or substantially perpendicular to the planar surface; and
the detection element is disposed in the planar portion.

12. The acceleration sensor according to claim 11, wherein a dimension of the planar portion in the width direction is larger than a dimension of the fixed-portion-side end portion in the width direction.

13. The acceleration sensor according to claim 10, wherein
the weight includes a recessed portion recessed in the width direction;
the fixed portion includes a protruding portion protruding in the width direction and facing the recessed portion; and
the beam is connected to the protruding portion and the recessed portion at positions near a center of mass of the weight.

14. An acceleration sensor comprising:
a planar surface;
a fixed portion;
a weight supported by only one connecting point of the fixed portion;
a beam extending along the planar surface and connected to the fixed portion and the weight; and
a detection element disposed in the beam and detecting stress due to deflection of the beam along the planar surface; wherein
the beam includes a through-hole extending therethrough in a thickness direction that is perpendicular to the planar surface;
a position of the detection element in the extension direction overlaps that of the through-hole; and
a dimension of the beam in the width direction, which is a direction parallel or substantially parallel to the planar surface and perpendicular or substantially perpendicular to the extension direction, is larger than a dimension, in the width direction, of a connection portion at which the beam is connected to the fixed portion.

15. The acceleration sensor according to claim 14, wherein
the beam includes a width-direction protrusion protruding in the width direction; and
the position of the detection element in the extension direction is displaced from that of the width-direction protrusion.

16. The acceleration sensor according to claim 14, wherein the beam includes:
a fixed-portion-side end portion connected to the fixed portion;
a weight-side end portion connected to the weight; and
a planar portion disposed between and connected to the fixed-portion-side end portion and the weight-side end portion, the planar portion having a dimension in a thickness direction that is smaller than a dimension in the thickness direction of each of the fixed-portion-side end portion and the weight-side end portion, the thickness direction being a direction perpendicular or substantially perpendicular to the planar surface; and the detection element is disposed in the planar portion.

17. The acceleration sensor according to claim 16, wherein a dimension of the planar portion in the width direction is larger than a dimension of the fixed-portion-side end portion in the width direction.

18. The acceleration sensor according to claim 14, wherein the weight includes a recessed portion recessed in the width direction;

the fixed portion includes a protruding portion protruding in the width direction and facing the recessed portion; and the beam is connected to the protruding portion and the recessed portion at positions near a center of mass of the weight.

* * * * *